(12) United States Patent
Samuelson et al.

(10) Patent No.: US 10,036,101 B2
(45) Date of Patent: *Jul. 31, 2018

(54) GAS-PHASE SYNTHESIS OF EPITAXIAL SEMICONDUCTOR WIRES FROM SEED CRYSTALS

(71) Applicant: QUNANO AB, Lund (SE)

(72) Inventors: Lars Samuelson, Malmo (SE); Martin Magnusson, Malmo (SE); Knut Deppert, Lund (SE); Magnus Heurlin, Furulund (SE)

(73) Assignee: QUNANO AB, Lund (SE)

( * ) Notice: Subject to any disclaimer, the term of this patent is extended or adjusted under 35 U.S.C. 154(b) by 25 days.

This patent is subject to a terminal disclaimer.

(21) Appl. No.: 15/255,766

(22) Filed: Sep. 2, 2016

(65) Prior Publication Data

US 2017/0051432 A1 Feb. 23, 2017

Related U.S. Application Data

(63) Continuation of application No. 13/696,611, filed as application No. PCT/SE2011/050599 on May 11, 2011, now Pat. No. 9,447,520.

(30) Foreign Application Priority Data

May 11, 2010 (SE) ...................... 1050466

(51) Int. Cl.
*C30B 25/02* (2006.01)
*C30B 25/00* (2006.01)
(Continued)

(52) U.S. Cl.
CPC ............ *C30B 25/005* (2013.01); *B82Y 30/00* (2013.01); *B82Y 40/00* (2013.01); *C30B 25/00* (2013.01);
(Continued)

(58) Field of Classification Search
CPC ....... C30B 25/00; C30B 25/005; C30B 25/02; C30B 25/14; C30B 25/16; C30B 25/165;
(Continued)

(56) References Cited

U.S. PATENT DOCUMENTS 9,447,520 B2 * 9/2016 Samuelson ............ B82Y 30/00
2002/0184969 A1 12/2002 Kodas et al.
(Continued)

FOREIGN PATENT DOCUMENTS

JP 2001155999 A 6/2001
JP 2004-507104 A 3/2004
(Continued)

OTHER PUBLICATIONS

S.H. Kim, et al. publication entitled "Understanding ion-mobility and transport properties of aerosol nanowires," Aerosol Science, vol. 38, pp. 823-842 (2007).*

(Continued)

*Primary Examiner* — Kenneth A Bratland, Jr.
(74) *Attorney, Agent, or Firm* — The Marbury Law Group PLLC (57) ABSTRACT

The present invention provides a method and a system for forming wires (1) that enables a large scale process combined with a high structural complexity and material quality comparable to wires formed using substrate-based synthesis. The wires (1) are grown from catalytic seed particles (2) suspended in a gas within a reactor. Due to a modular approach wires (1) of different configuration can be formed in a continuous process. In-situ analysis to monitor and/or to sort particles and/or wires formed enables efficient process control.

20 Claims, 6 Drawing Sheets

(51) Int. Cl.
　　　*B82Y 30/00*　　(2011.01)
　　　*B82Y 40/00*　　(2011.01)
　　　*C30B 29/40*　　(2006.01)
　　　*C30B 29/62*　　(2006.01)
　　　*C30B 29/42*　　(2006.01)

(52) U.S. Cl.
　　　CPC ............ *C30B 29/40* (2013.01); *C30B 29/403* (2013.01); *C30B 29/42* (2013.01); *C30B 29/62* (2013.01)

(58) Field of Classification Search
　　　CPC ....... C30B 29/00; C30B 29/40; C30B 29/403; C30B 29/42; C30B 29/62; Y10S 977/00; Y10S 977/762; Y10S 977/813; Y10S 977/814; Y10S 977/815; Y10S 977/816; Y10S 977/817; Y10S 977/818; Y10S 977/819; Y10S 977/82; Y10S 977/824; B82Y 30/00; B82Y 40/00; Y10T 117/00; Y10T 117/10; Y10T 117/1002; Y10T 117/1004; Y10T 117/102
　　　USPC ........ 117/84, 86–89, 93, 102, 104–105, 937, 117/954
　　　See application file for complete search history.

(56) References Cited

U.S. PATENT DOCUMENTS

| | | | |
|---|---|---|---|
| 2003/0089899 A1* | 5/2003 | Lieber | B82Y 10/00 257/9 |
| 2004/0005723 A1* | 1/2004 | Empedocles | B82Y 10/00 438/1 |
| 2004/0075464 A1* | 4/2004 | Samuelson | B82Y 10/00 326/37 |
| 2004/0109814 A1 | 6/2004 | Simard et al. | |
| 2004/0179989 A1 | 9/2004 | Height et al. | |
| 2005/0011431 A1* | 1/2005 | Samuelson | B82Y 10/00 117/40 |
| 2005/0054004 A1 | 3/2005 | Alivisatos et al. | |
| 2008/0102019 A1 | 5/2008 | Jeong et al. | |
| 2009/0004552 A1 | 1/2009 | Sun et al. | |
| 2009/0008942 A1 | 1/2009 | Clement et al. | |
| 2009/0053126 A1 | 2/2009 | Lee et al. | |
| 2013/0098288 A1 | 4/2013 | Samuelson et al. | |

FOREIGN PATENT DOCUMENTS

| | | |
|---|---|---|
| JP | 2004507104 A | 3/2004 |
| JP | 2005244240 A | 9/2005 |
| JP | 2007-527844 A | 10/2007 |
| JP | 2007527844 A | 10/2007 |
| WO | WO2002/076887 A2 | 10/2002 |
| WO | WO2004/004927 A1 | 1/2004 |
| WO | WO2004/038767 A2 | 5/2004 |
| WO | WO2005/027201 A1 | 3/2005 |
| WO | WO2007/102781 A1 | 9/2007 |

OTHER PUBLICATIONS

European Patent Office Communication Pursuant to Article 94(3) EPC for European Patent Application No. 11780888.1, dated May 16, 2017, 4 pages.

Fourth Chinese Office Action for Chinese Patent Application No. 201180034310.X, dated Nov. 1, 2016; with English-Language Translation, 11 pages.

Japanese Office Communication, Decision of Final Rejection, for Japanese Patent Application No. JP 2016-016818, dated May 23, 2017, 2 pages with English-language translation.

Kim, S. H. et al., "Understanding ion-mobility and transport properties of aerosol nanowires," Journal of Aerosol Science, vol. 38, No. 8, Aug. 2007, pp. 823-842.

Japan Patent Office Communication, Report of Reconsideration by Examiner before Appeal, for Japanese Patent Application No. 2016-016818, dated Oct. 26, 2017, 4 pages, including English-language translation.

S.H. Kim et al. (Aug. 2007) "Understanding ion-mobility and transport properties of aerosol nanowires" Journal of Aerosol Science, vol. 38, Issue 8, pp. 823-842; pp. 823-826; figure 1.

C.S. Kim et al, (2010) "Generation of Charged Nanoparticles During the Synthesis of Silicon Nanowires by Chemical Vapor Deposition" J. Phys. Chem. C, 114 (8), pp. 3390-3395; pp. 3390-3392; figures 1,3.

Magnusson et al. (1999) "Gold Nanoparticles: Production, Reshaping, and Thermal Charging" J Nanoparticle Res 1, 243-251.

International Search and Written Opinion dated Jun. 29, 2011, in corresponding PCT Application No. PCT/SE2011/050599.

Cui et al., "Doping and Electrical Transport in Silicon Nanowires", J. Phys. Chem. B, vol. 104(22), pp. 5213-5216 (2000).

Duan, X. et al., "Indium phosphide nanowires as building blocks for nanoscale electronic and optoelectronic devices", Nature, vol. 409, pp. 66-69 (2001).

Hu, J. et al., "Chemistry and Physics in one Dimension:Synthesis and Properties of Nanowires and Nanotubes", Accounts of Chemical Research, ACS, vol. 32(5), pp. 435-445 (1999).

Huang, Y. et al., "Nanowires for integrated multicolor nanophotonics", Small, Wiley-VCH Verlag GmbH & Co. KGaA, vol. 1 (1), pp. 142-147 (2005).

Huang, Y. et al., "Directed Assembly of One-Dimensional Nanostructures into Functional Networks", Science, vol. 291, pp. 630-633 (2001).

Lauhon L., et al., "Epitaxial core-shell and core-multishell nanowire heterostructures", Nature, vol. 420, pp. 57-61 (2002).

Morales, A., et al., "A Laser Ablation Method for the Synthesis of Crystalline Semiconductor Nanowires", Science, vol. 279, pp. 208-211 (1998).

Nyamori, V. et al., "The use of organometallic transition metal complexes in the synthesis of shaped carbon nonomaterials", J. of Organometallic Chemistry, vol. 693, pp. 2205-2222 (2008).

Qian, F. et al.,"Gallium Nitride-based nanowire radial heterostructures for nanophotonics", Nano Letters, vol. 4 (10), pp. 1975-1979.

Wang, J. et al., "Highly polarized photoluminescence and photodetection from single indium phosphide nanowires", Science, vol. 293, pp. 1455-1457 (2001).

Wu, Y. et al., "Controlled Growth and Structures of Molecular-Sacal silicon nanowires", Nano Letters vol. 4(3), pp. 433-436 (2004).

Extended European Search Report and written opinion received in connection with European application No. EP 11780888.1, dated Nov. 15, 2013.

Japanese Patent Office Notice of Reasons for Rejection for Patent Application No. 2013-510045, dated Feb. 10,2015.

Japanese Patent Office Final Rejection for Japanese Patent Application No. 2013-510045, dated Oct. 6, 2015, 2 pages.

Second Chinese Office Action for Chinese Application No. 201180034310.X, dated Aug. 24, 2015; with English-Language Translation.

Third Chinese Office Action for Chinese Application No. 201180034310.X, dated Apr. 21, 2016; with English-Language Translation.

Japanese Office Action, Notice of Reasons for Rejection and Notice under Art. 50-2, for Japanese Patent Application No. 2016-016818, dated Nov. 22, 2016; with English-Language Translation, 9 pages.

* cited by examiner

GAS-PHASE SYNTHESIS OF EPITAXIAL SEMICONDUCTOR WIRES FROM SEED CRYSTALS

TECHNICAL FIELD OF THE INVENTION

The present invention relates to formation of wires and in particular to gas-phase synthesis of wires in the absence of a substrate. The gas-phase synthesis is applicable to different materials, and in particular to semiconductor materials.

BACKGROUND OF THE INVENTION

Small elongated objects, usually referred to as nanowires, nanorods, nanowhiskers, etc. and typically comprising semiconductor materials, have up till now been synthesized using one of the following routes:
- liquid phase synthesis, for example by means of colloidal chemistry as exemplified US 2005/0054004 by Alivisatos et al,
- epitaxial growth from substrates, with or without catalytic particles as exemplified by the work of Samuelson et al presented in WO 2004/004927 A2 and WO 2007/10781 A1, respectively, or
- gas phase synthesis by means of a laser assisted catalytic growth process as exemplified by WO 2004/038767 A2 by Lieber et al.

The properties of wires obtained using these routes are compared in the following table.

|                    | Material quality | Width/length and size control | Structural complexity | Scalability/cost of production |
|---|---|---|---|---|
| Liquid phase       | HIGH   | THIN/SHORT MEDIUM control | LOW  | HIGH/HIGH    |
| Substrate-based    | HIGH   | ALL/ALL HIGH control      | HIGH | LOW/HIGH     |
| Laser assisted     | MEDIUM | THIN/LONG MEDIUM control  | LOW  | MEDIUM/MEDIUM|

Consequently, the choice of synthesis route is a compromise between different wire properties and cost of production. For example substrate-based synthesis provides advantageous wire properties but since wires are formed in batches the scalability of the process, and thus the production cost and through-put, are limited.

SUMMARY OF THE INVENTION

In view of the foregoing one object of the invention is to provide a method and a system for forming wires that enables a large scale process combined with a structural complexity and material quality comparable to wires formed using substrate-based synthesis.

The method comprises the basic steps of
providing catalytic seed particles suspended in a gas,
providing gaseous precursors that comprises constituents of the wires to be formed,
passing the gas-particle-precursor mixture through a reactor, typically a tube furnace, and
growing the wires from the catalytic seed particles in a gas-phase synthesis including the gaseous precursors while the catalytic seed particles are suspended in the gas.

In a first aspect of the invention wires of different configuration such as wires made of essentially the same material, unipolar wires, or more complex wires such as wires with axial pn- or pin-junctions, wires with radial pn- or pin-junctions, heterostructure wires, etc. can be provided by varying the growth conditions during growth of each wire, such that a wire segment is axially grown on a previously formed wire portion in a longitudinal direction thereof, or a shell is radially grown on the previously formed wire portion in a radial direction thereof, or material is added as a combination of axial and radial growth. The growth conditions can be varied between the reaction zones by controlling one or more of parameters associated with: precursor composition, precursor molar flow, carrier gas flow, temperature, pressure or dopants. This variation is in practice achieved by performing the wire growth in two or more zones, which may be kept at different temperature, and into which suitable growth or dopant precursor molecules are injected by means of mass flow controllers or similar devices.

Growth conditions can also be varied over time by controlling one or more of parameters associated with: precursor composition, precursor molar flow, carrier gas flow, temperature, pressure or dopants, or the size distribution of the catalytic seed particles, such that the wire properties can be varied from time to time, either to produce a batch with a range of different wires, or to produce distinct homogeneous batches.

The catalytic seed particles can be provided as an aerosol that is mixed with the gaseous precursors prior to, or during, initiation of wire growth. Alternatively the catalytic seed particles are formed by formation from gaseous reactants that comprises at least one of the constituents of the catalytic particles, thereby enabling a self-catalyzed wire growth.

Preferably, the method of the invention comprises providing a flow of the gas that carries the catalytic seed particles and subsequently the partly or fully formed wires through one or more reactors, each reactor comprising one or more reaction zones. Thereby the catalytic seed particles and any wires formed thereon flow sequentially through one or more reaction zones, where each reaction zone contributes to the wire growth by adding material to the wire or etching the wire. This enables to provide optimum conditions for each step in the growth process.

The diameter of the wires is partly determined by the size of the catalytic particles. Thus the diameter of the wires can be controlled by choosing an appropriate size or size distribution of the catalytic seed particles and by adjusting the growth conditions to the size of the catalytic seed particles.

In the case of a second reaction furnace or reaction zone, continued wire growth occurs on pre-fabricated semiconductor wires with attached catalytic particles, formed in the first reactor. These wires act as flying substrates, and consequently growth will take place more readily than in the first zone, where wire nucleation takes place on the seed particles. Therefore, wire growth in subsequent furnaces is more efficient and takes place at lower temperatures. Depending on growth conditions (reactor temperature and pressure, precursor type and concentration, seed particle/wire size and concentration, and reaction time) the subsequent wire growth takes place in the axial or radial direction, or as a combination of both.

In one aspect of the invention, the method comprises addition of HCl or other etching halide compound to the flow of aerosol, to emulate the conditions in hydride vapour phase epitaxy, HVPE, preventing growth on the hot wall of the reactor. HVPE sources, where metallic group-III atoms are carried as chlorides to the reaction zone, can also be used in this invention.

In another aspect of the invention, the seed particles/wires are heated by means of microwaves, infrared light or other electromagnetic radiation, instead of or as a complement to the hot wall tube furnace. This allows the gas to remain more or less cold, minimizing the amount of gas-phase reactions, while allowing growth on the hot particle/wire surfaces.

In yet another aspect of the invention the method comprises in-situ analysis of the wires or the partly grown wires to obtain the desired wire properties. Means for controlling the wire growth involve control of the size of the catalytic seed particles, but also control of growth conditions by controlling one or more of parameters associated with: precursor composition, precursor molar flow, carrier gas flow, temperature, pressure or dopants, in one or more of the reaction zones mentioned above. The in-situ analysis provides means for obtaining feed-back in a control loop not available in for example substrate-based synthesis. Any deviation from desired properties is rapidly detected and the growth conditions can be adjusted without significant delay or without having to discard a significant number of wires.

Means for in-situ analysis include means for detecting the size of the catalytic seed particles and/or the wires formed, such as a differential mobility analyser (DMA), illumination and detection of luminescence from the wires formed, absorption spectroscopy, Raman spectroscopy and X-ray powder diffraction on-the-fly, etc. In addition to the possibility to control the wire growth in "real-time" the in-situ analysis can also be used to selectively sort wires having different properties, such as size. Although described in terms of wires, it should be appreciated that the in-situ analysis can be performed also on catalytic seed particles, or partly formed wires.

In yet another aspect of the invention the method comprises collection of the wires from the gas that carries the wires. The wires can be collected and stored for later use or they can be transferred to a different carrier or a substrate to be incorporated in some structure to form a device.

To take advantage of the continuous flow of wires the wires may be deposited and/or aligned on a substrate in a continuous process, such as a roll-to-roll process. The deposition and/or alignment can be assisted by an electric field applied over the substrate and further by charging the wires, and optionally also the substrate. By local charging of the substrate in a predetermined pattern wires can be deposited in predetermined positions on the substrate. Thus the present invention provides a continuous, high through-put, process for manufacturing aligned wires on a substrate, optionally with "real-time" feed-back control to obtain high quality wires.

The wires produced by the method of the invention can be utilised to realise wire based semiconductor devices such as solar cells, field effect transistors, light emitting diodes, thermoelectric elements, field emission devices, nano-electrodes for life sciences, etc which in many cases outperform conventional devices based on planar technology.

Although not limited to nanowires, semiconductor nanowires produced by the method of the invention possess some advantages with respect to conventional planar processing. While there are certain limitations in semiconductor devices fabricated using planar technology, such as lattice mismatch between successive layers, nanowire formation in accordance with the invention provides greater flexibility in selection of semiconductor materials in successive segments or shells and hence greater possibility to tailor the band structure of the nanowire. Nanowires potentially also have a lower defect density than planar layers and by replacing at least portions of planar layers in semiconductor devices with nanowires, limitations with regards to defects can be diminished. Further, nanowires provide surfaces with low defect densities as templates for further epitaxial growth. As compared to substrate-based synthesis lattice mismatch between substrate and wire does not have to be considered.

The apparatus of the invention comprises at least one reactor for growing wires, said reactor comprising one or more reaction zones, means for providing catalytic seed particles suspended in a gas to the reactor, means for providing gaseous precursors that comprises constituents of the wires to be formed to the reactor, and means for collecting wires grown from the catalytic seed particles in a gas-phase synthesis including the gaseous precursors while the catalytic seed particles are suspended in the gas.

A plurality of reactors, each providing a reaction zone, or reactors that are divided into different reaction zones, or a combination thereof can be used to enable change of growth conditions during growth of each wire. During processing the catalytic particles, the partly grown wires and the fully grown wires are carried by a gas flow sequentially through the reactors.

Preferably the apparatus further comprises means for in-situ analysis of the wires formed. In one embodiment of the invention said means for in-situ analysis is arranged for detection of wire properties after one of said reaction zones and a signal from said means for in-situ analysis is fed back to a means for controlling the growth conditions upstream.

One advantage of the method and apparatus in accordance with the invention is that wires can be grown at a surprisingly high rate. Growth rates may be higher than 1 µm/s, which implies a growth time of a few seconds for a typical wire of 0.4×3 µm dimension. This means that, in a continuous process in accordance with the invention the through-put is tremendous.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein FIG. 1 schematically illustrates axial growth of a nanowire in accordance with the invention, FIGS. 2a-2h schematically illustrate a system for forming wires, in (a) with a single reactor, and in (b) extended to a modular system with a plurality of reactors, in (c-h) examples of different sub-modules in accordance with the invention, FIG. 3 schematically illustrates axial growth of a wire comprising a pn-junction in accordance with the invention, FIG. 4 schematically illustrates core-shell growth of a wire comprising a pn-junction in accordance with the invention, FIG. 5 schematically illustrates a system for forming wires comprising in-situ analysis modules in accordance with the invention, FIG. 6 schematically illustrates a first embodiment of a system for forming nitride based LED structures with different emission wavelengths in accordance with the invention, FIG. 7 schematically illustrates a second embodiment of a system for forming nitride based LED structures with different emission wavelengths in accordance with the invention, FIG. 8 schematically illustrates an arrangement for in-situ photo luminescence measurements in a system for forming wires in accordance with the invention, FIG. 9 schematically illustrates an arrangement for in-situ absorption measurements in a system for forming wires in accordance with the invention, and FIG. 10

DETAILED DESCRIPTION OF EMBODIMENTS

For the purpose of this application the term wire refers to an elongated object. As mentioned above, these wires may be of essentially nanometer dimensions in their width or diameter, commonly referred to as nanowires, nanowhiskers, nanorods, etc., however not limited to this.

Figure 1:
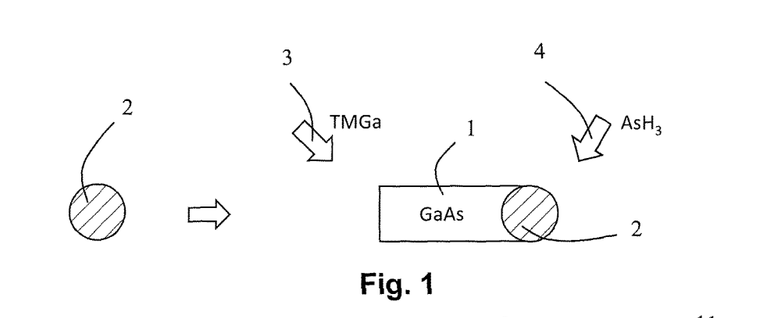

Referring to FIG. 1, basically a method for forming wires in accordance with the invention comprises
providing catalytic seed particles 2 suspended in a gas,
providing gaseous precursors 3, 4 that comprises constituents of the wires 1 to be formed, and
growing the wires 1 from the catalytic seed particles 2 in a gas-phase synthesis including the gaseous precursors 3, 4 while the catalytic seed particles are suspended in the gas.

The growth, or at least part thereof, is performed at an elevated temperature, typically in a furnace or some other kind of reactor, and starts with an initiation of the growth by catalytic decomposition of the gaseous precursors 3, 4 on the surface of the catalytic seed particles 2 and nucleation. After nucleation the wire 1 grows directionally and forms an elongated object, i.e. a wire. Preferably the gas flows through the reactor and thereby carries at least the catalytic seed particles and thus the wires formed on the catalytic seed particles through the reactor.

The method is described herein in terms of semiconductor materials, in particular III/V-materials, however not limited to this. By way of example, FIG. 1 schematically illustrates the formation of a GaAs wire 1 from a catalytic seed particle 2, such as gold, and gaseous precursors TMGa 3 and $AsH_3$ 4. As shown the catalytic particles are carried forward by the gas into a reactor where the gaseous precursors 3, 4 are present and the reaction takes place. The precursor gases may be added to the gas flow prior to entering the reactor or directly to the reactor.

Figure 2A:
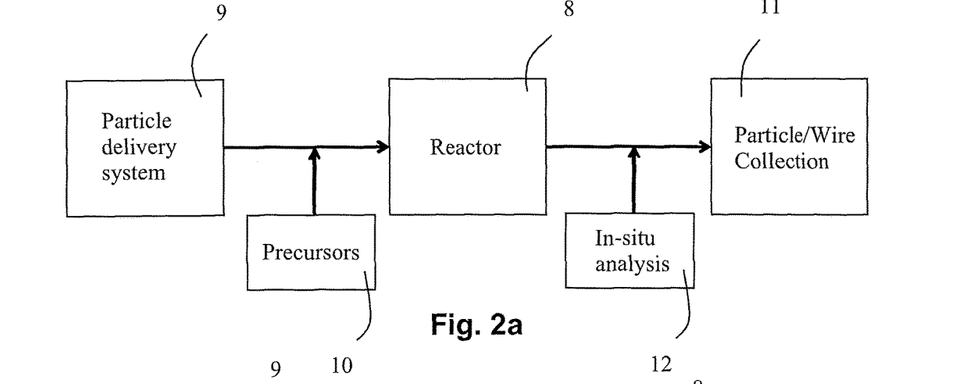

A basic system for forming wires in accordance with the present invention is schematically illustrated in FIG. 2a. The system comprises at least one reactor 8 for growing wires 1, means 9 for providing catalytic seed particles suspended in a gas to the reactor 8, and means 10 for providing gaseous precursors 3, 4 that comprises constituents of the wires 1 to be grown from the catalytic seed particles in a gas-phase synthesis including the gaseous precursors while the catalytic seed particles are suspended in the gas. Optionally the system further comprises means 11 for collecting the wires 1. The system may also comprise means for in-situ analysis 12 of particles and wires formed in the reactor 8, such as differential mobility analyzers (DMAs) or other analysis tools to monitor the dimension or other properties of the wires.

In one embodiment of the method of the invention the wire growth is performed in one or more reactors arranged in sequence and/or in parallel, where a continuous flow of catalytic seed particles is supplied as an aerosol, which is mixed with gaseous precursors 3, 4, and then the gas mixture enters a first reactor of said one or more reactors where the wire growth is initiated. The catalytic seed particles 2 can also be formed by gaseous reactants inside said first reactor, thereby enabling a self-catalyzed wire growth. When performing the wire growth in a plurality of reactors, each reactor increases the complexity of the wires, e.g., to make pn-junctions or heterostructures in the axial or radial direction.

Figure 2B:
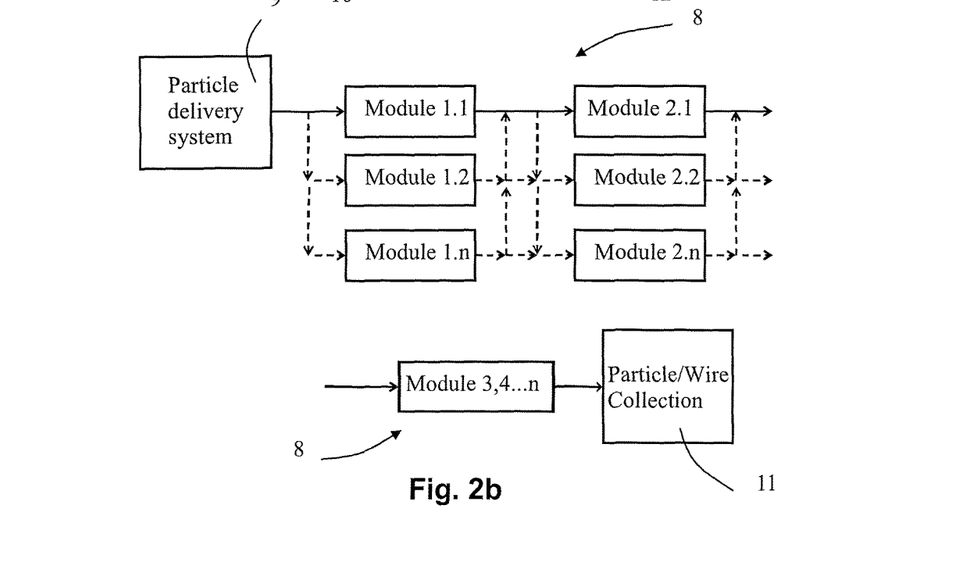
Figure 2C:
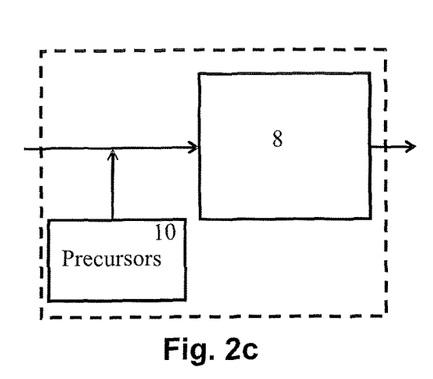
Figure 2D:
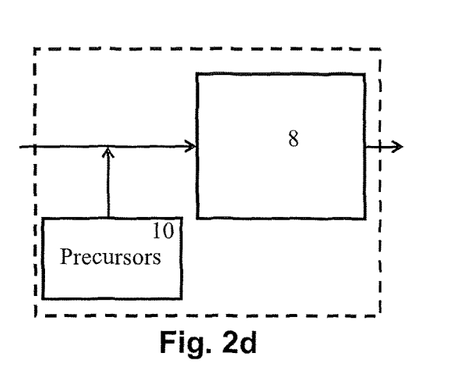
Figure 2E:
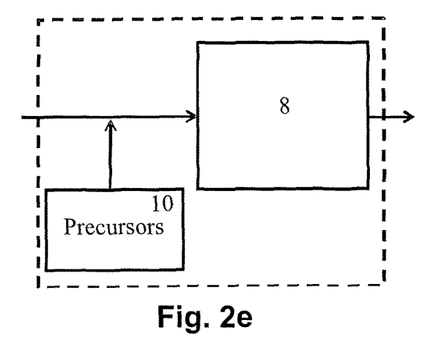
Figure 2F:
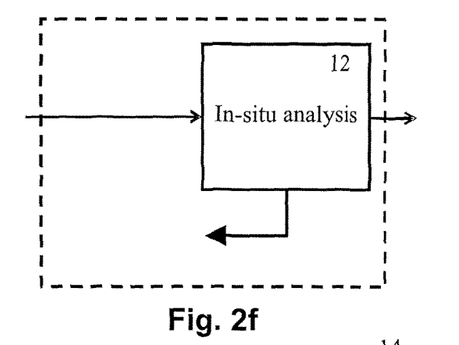
Figure 2G:
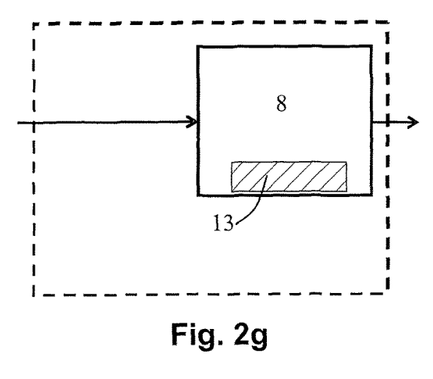
Figure 2H:
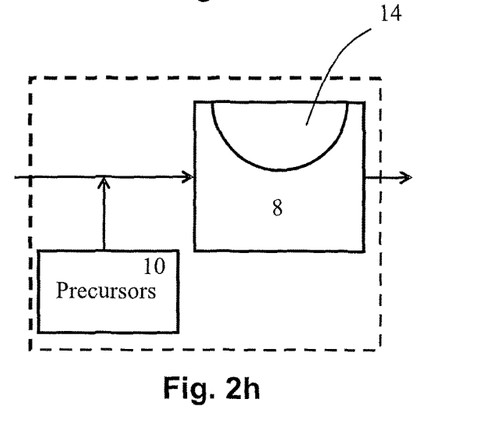

The reactors, the means for providing catalytic seed particles, means for in-situ analysis, etc. of said system do not have to be separate chambers or arrangements. Preferably the system is a modular system combined in an in-line production apparatus. In particular, each reactor may comprise one or more reaction zones arranged in sequence and/or in parallel as described for the reactors above. Hence since a reaction zone has the same function as a reactor, these terms are interchangeably used hereinafter. FIG. 2b schematically illustrates such a modular system with particle delivery system 9, several growth modules arranged in series and in parallel and means for collecting the particles and wires being carried out from the growth modules by the gas flow. FIGS. 2a-2h show other examples of modules that can be incorporated in the system: (c) a wire growth module, (d) a shell growth module, (e) a passivation layer growth module, (f) an in-situ analysis tool 12 (with the arrow indicating the possibility to feed-back control), such as a DMA, (g) an evaporation module with an evaporation source 13 and (h) a plasma-enhanced chemical vapour deposition module with a plasma source 14, however not limited to this.

Figure 3:
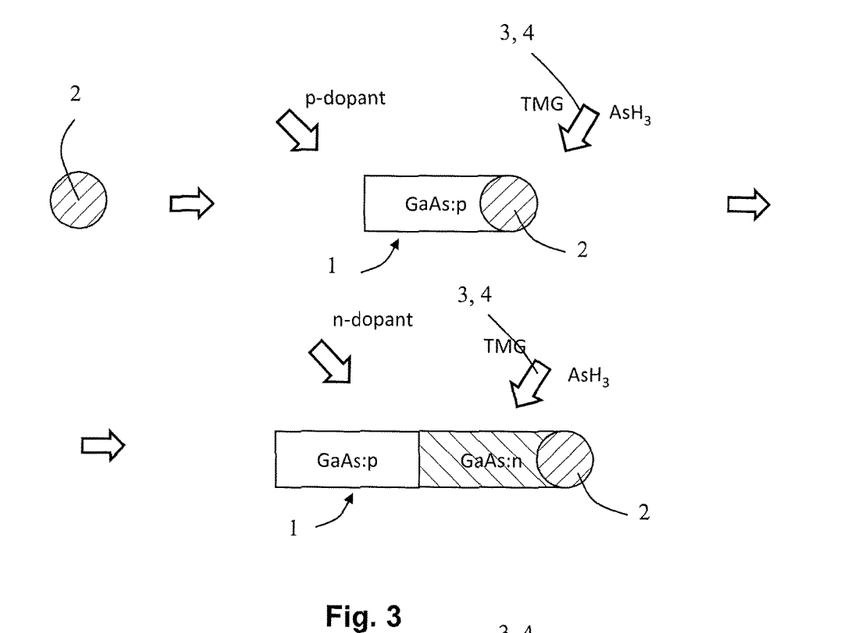

FIG. 3 schematically illustrates how the method of the invention can be used to form a GaAs wire comprising an axial pn-junction between a p-doped GaAs segment and an n-doped GaAs segment. Precursors 3, 4 comprising group III material and group V material, respectively, and p-dopants are provided to a reactor and, after nucleation, p-doped GaAs is axially grown from the catalytic seed particle, thereby forming a first axial segment of the GaAs wire. Thereafter the growth conditions are changed by exchanging the p-dopant to an n-dopant, while substantially maintaining other parameters related to the growth conditions, such that a second axial wire segment is axially grown on the previously formed first segment in a longitudinal direction thereof. This illustrates the possibility to vary the growth conditions during axial growth to obtain axial segments with different properties.

Figure 4:
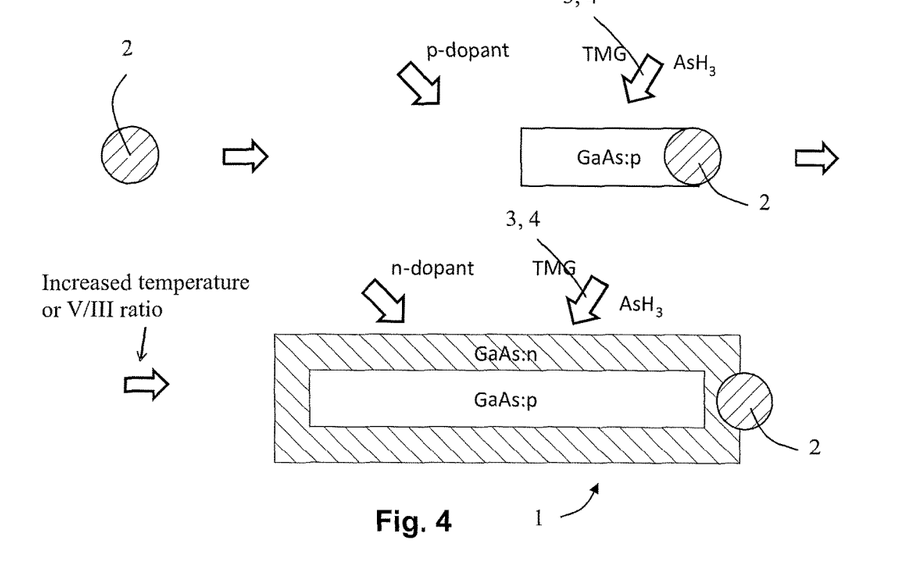

FIG. 4 schematically illustrates the formation of a GaAs wire comprising a radial pn-junction between a p-doped GaAs core and an n-doped GaAs shell. Precursors 3, 4 comprising group III material and group V material, respectively, and p-dopants are provided to the reactor and after nucleation p-doped GaAs is axially grown from the catalytic seed particle, thereby forming the core of the GaAs wire. Thereafter the growth conditions are changed by increasing the temperature and/or the V/III-ratio to promote radial growth and by exchanging the p-dopant to an n-dopant. Thereby the shell is radially grown on the previously formed core in a radial direction thereof. This illustrates the possibility to vary the growth conditions to switch between axial growth and radial growth.

Although exemplified with GaAs, it should be appreciated that other III/V semiconductor materials as well as semiconductor materials comprising group II and group VI materials can be processed in the same way. For example the gaseous precursors of the above examples can be exchanged for TMIn and $PH_3$ to form InP wires. As appreciated to a person skilled in the art the reactor configuration does not have to be changed to form wires from different gaseous precursors, the gaseous precursors are simply switched. Moreover, the processes such as those exemplified by FIG. 3 and FIG. 4 can be performed with or without dopant. Insulators can also be grown. Single or multiple reactors or reaction zones within a reactor can be used to improve formation of segments, cores or shells having different composition, doping or conductivity type. Moreover, axial and radial growth is not necessarily fully decoupled but the wire can grow both radially and axially at the same time. By choosing appropriate gaseous precursor, flows, temperatures, pressures, and particle sizes, the wire material can be made to grow in the axial or radial direction, or in a combination of the two growth modes.

The catalytic seed particles may consist of a single element, or a combination of two or more elements, to assist in the wire growth or dope the wire. Gaseous precursors may also be used to dope the wire.

In case of pre-forming the catalytic seed particles said means for providing catalytic seed particles 9 may comprise a particle generator. The particle generator produces an aerosol of more or less size-selected particles by a range of prior art methods. Particle generation can be done by evaporation/condensation, spray or vapor pyrolysis, spark discharge, laser ablation, electrospraying of colloidal particles, etc. Size selection can be done by gas mobility classification, e.g. by using a DMA, virtual impaction, or simply well-controlled particle formation. For many applications, it is desirable that the aerosol particles be electrically charged, which can be accomplished by radioactive sources, corona discharge, thermal or optical emission of electrons, etc. A typical system for particle generation is described in Magnusson et al., Gold nanoparticles: production, reshaping, and thermal charging, J Nanoparticle Res 1, 243-251 (1999).

Figure 5:
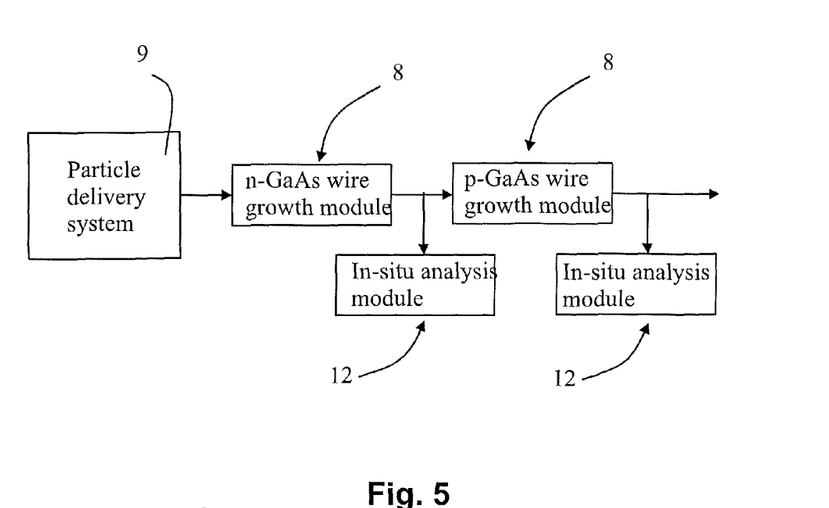

As mentioned above, the system may comprise one or more reactors or reaction zones, where each reactor or reaction zone adds a new functional layer to the wires. Such a modular system is shown in FIG. 5, and is further described below. Depending on the growth parameters, such as precursor molecules, temperature, pressure, flows, particle density and particle size, the new functional layer can be added as an axial extension of the previously formed wires, as a radial shell, or as a combination of both axial and radial growth. The formed layers can be of similar or dissimilar material, i.e., homo- or heteroepitaxy, and of similar or dissimilar conduction type, e.g., a pn-junction. The functional layers are not limited to crystalline layers formed by epitaxy but can also be amorphous layers such as oxides, providing a passivating and/or insulating functionality. Chemical reactions to coat the wires with surfactants or a polymer shell, or condensation of sacrificial layers for later re-dispersion are other possibilities.

For some growth conditions, additional modules may be added to the reactor or the reaction zone. For example a plasma generator may be added to modify the chemical reactions to enable higher reaction rates. This is important especially if the wire or layer formed on the wire is grown at low temperature by a stable precursor which usually requires a high temperature to decompose. A typical example where this may be useful is for growth of nitrides from ammonia.

Before or between the reactors or reaction zones, further components may be placed, for example means for charging particles or wires. A tube-shaped absorption filter can be used to remove precursor molecules and small particles from the gas flow, by taking advantage of a comparatively low diffusion coefficient of the wires. Precursors and reactants can thereby be replaced, not only added, between the growth reactors. Size classification tools, such as DMA or virtual impactor, can also be used to refine the gas flow, i.e. the aerosol, or as in-situ analysis as explained below.

Referring to FIG. 5, in the following one implementation of the method of the invention is described in terms of growing GaAs wires containing a pn-junction. The system comprises a particle delivery system that can consist of any of the prior mentioned particle generators. The particles are generated and then carried by a gas flow such as $H_2$ or $N_2$ from the particle delivery system. Hereinafter, the gas flow containing particles or wires is termed an aerosol. The GaAs (n-type) wire growth module consists of a reaction furnace and a gas delivery system for the precursor molecules. In this case the precursor molecules are TMGa, $AsH_3$ and $SiH_4$. TMGa and $AsH_3$ form the GaAs material while $SiH_4$ dopes the wires with Si resulting in an n-type material. The precursor molecules are mixed with the aerosol prior to entering the reaction furnace. Upon entering the reaction furnace the precursors react with the particles in the aerosol forming n-type GaAs wires. The growth parameters (temperature, flows, pressure etc.) are modified to obtain the desired properties (length, crystal structure, shape etc.). After the GaAs (n-type) wire growth module, the aerosol, which now consists of the carrier gas and n-type GaAs wires, exits the GaAs wire growth module, and is divided into a small flow and a large flow. The small flow enters a DMA which analyzes the wires size distribution. The larger flow enters the next wire growth module. The GaAs (p-type) wire growth module is designed to grow an axial extension of p-type GaAs on top of the previously grown n-type GaAs wires. The growth module has essentially the same design as the GaAs (n-type) wire growth module except for the precursors which now consist of TMGa, $AsH_3$ and DEZn. TMGa and $AsH_3$ form the axial extension of GaAs material while DEZn dopes the wires with Zn resulting in a p-type material. The growth parameters in this furnace are not necessarily the same as in the previous growth module but are instead optimized to obtain an axial extension of the wires with a high quality p-type GaAs material. Upon exiting the GaAs (p-type) wire growth module the aerosol is divided in a small and a large flow. The small flow enters a DMA which analyzes the wires size distribution. The large flow enters a wire collection module which can collect the wires by any of the prior mentioned methods.

By using a plurality means for in-situ analysis, such as the two in-situ DMAs of FIG. 5, the wire growth process can be monitored at intermediate states of the wire growth and if necessary, growth parameters can be adjusted to obtain consistent, high quality wires with the desired properties.

Figure 6:
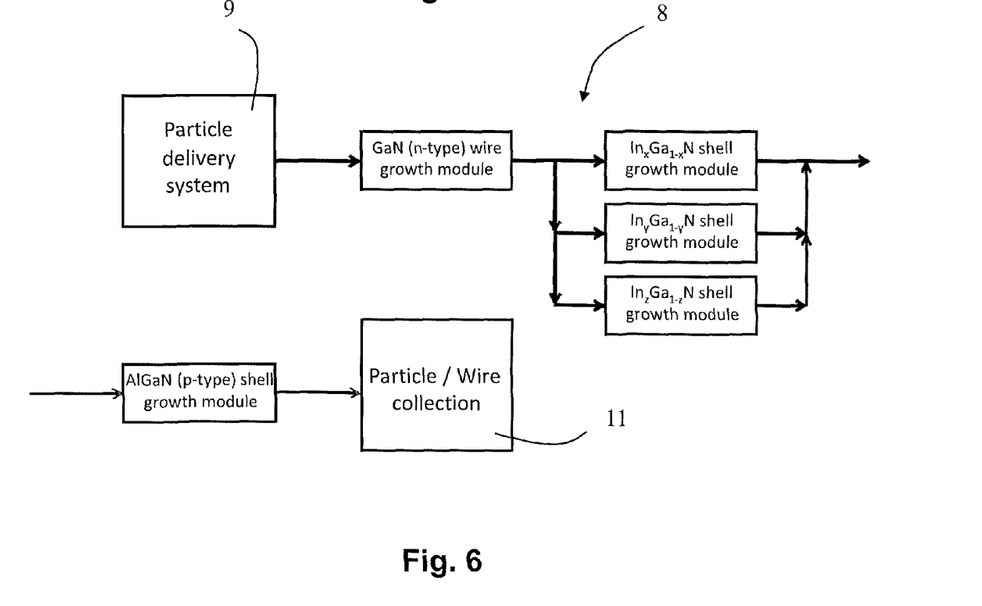

As mentioned above, said method and system of the invention can be used to form complex wire structures. By way of example, FIG. 6 schematically illustrates a system for growth of nitride-based light emitting diodes (LEDs) adapted to provide emission at different wavelengths. The system comprises a particle delivery system a GaN (n-type) wire growth module arranged in series followed by InGaN shell growth modules arranged in parallel prior to an AlGaN (p-type) shell module and finally a means for particle/wire collection. Hence, the gas flow is divided into parallel InGaN shell growth modules that are adapted to form InGaN shells having different composition, i.e. $In_xGa_{1-x}N$, $In_yGa_{1-y}N$ and $In_yGa_{1-y}N$ where $x \neq y \neq z$. Due to the different growth conditions in each of the branches the wires will obtain different emission characteristics. For example, wires adapted for emission in the red, green and blue wavelength regions can be accomplished. By collecting the at least partly formed wires from the InGaN shell growth modules into a common gas flow the different wires can be grown and collected simultaneously for assembly of white light LEDs.

Figure 7:
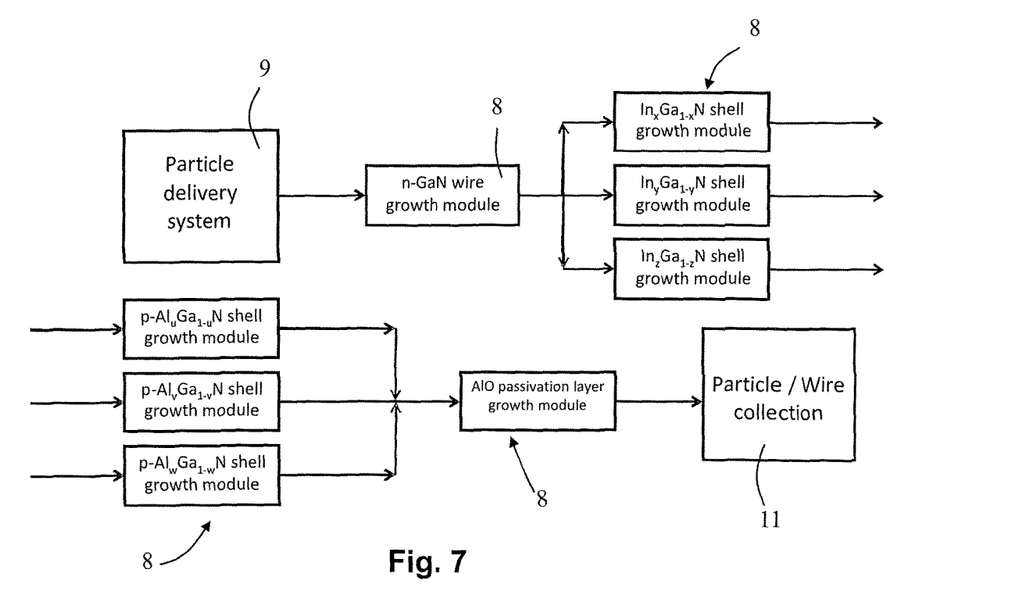

FIG. 7 schematically illustrates a similar system as shown in FIG. 6, although with the possibility of more control during growth since different InGaN quantum wells get different shells individually adapted for the quantum well structure. In addition to the parallel InGaN shell growth modules of the system of FIG. 6, each InGaN shell growth module is followed by a p-AlGaN growth module. However, a n-GaN wire growth module and a AlO passivation layer growth module following the p-AlGaN shell growth modules may be the same for different wires in order to reduce the complexity of the system.

The flexibility of the system allows for several in-situ analysis tools 12, to measure and monitor properties which are not obtainable using other wire growth techniques. This allows instant feedback to regulate the system, making it possible to continuously fine-tune material parameters in a way that is not possible in other methods.

By way of example, wire size measurement and sorting is achievable by using a DMA. The DMA, or any other means for in-situ analysis, can be coupled either in series or in parallel, depending on if the measurement is to be invasive or non-invasive on the gas flow. Coupled in series a DMA can sort the wires in the aerosol by their size. The size and size distribution which is sorted depends on the properties and settings of the DMA. Coupled in parallel, a small aerosol flow can be extracted to the DMA for an almost non-invasive measurement. In this case the DMA can scan within its size detection range to give the size distribution of the aerosol. This can be done while only wasting a small part of the gas flow thus maintaining a high production rate of wires.

By illuminating the gas flow, the optical properties of the wires can be studied in a non-invasive manner. The light source should preferably be a laser where the energy of the light is higher than the band gap of one or more materials that the wires consist of. By using a photodetector, the luminescence from the wires can be studied. This enables monitoring of the optical properties of the wires, which can be used to tune growth parameters to obtain the desired properties of the wires. This is in contrast to other growth methods in that the wires may be cooled down rapidly after each successive growth reactor or reaction zone and the temperature sensitive photoluminescence technique can be used between each step in the wire growth.

Further possible in-situ optical methods include absorption spectroscopy, where the absorption path would ideally be along the wire flow; Raman spectroscopy (especially Coherent anti-Stokes Raman Spectroscopy, CARS), which can also be used inside reaction furnaces to study decomposition of molecules and temperature gradients; and X-ray powder diffraction on-the-fly.

Depending on the type of wires being produced, different collection methods are possible. For charged wires, they are easily collected on any substrate by means of an electric field. The aerosol may be bubbled through a liquid to remove the wires from the gas flow, with or without surfactant molecules to keep the wires from agglomerating. Wires that are easily re-dispersed may be collected in a filter as a dry powder.

Figure 8:
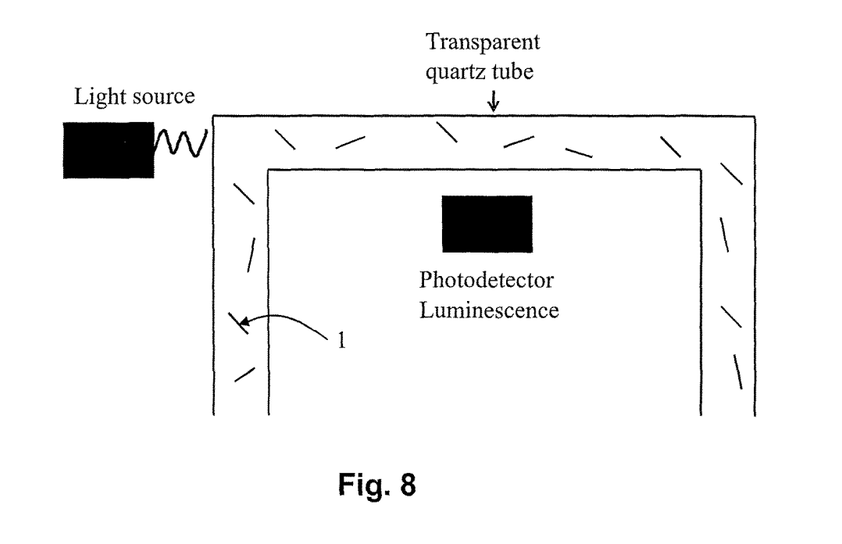

FIG. 8 schematically illustrates an arrangement for in-situ photo luminescence (PL) measurements in a system for forming wires in accordance with the invention. This PL arrangement comprises a light source and a photodetector arranged at e.g. a transparent quartz tube. For an appropriate luminescence measurement the light source should be a laser with light of higher energy than the bandgap of the semiconductor material of the wires flowing through said transparent quartz tube.

Figure 9:
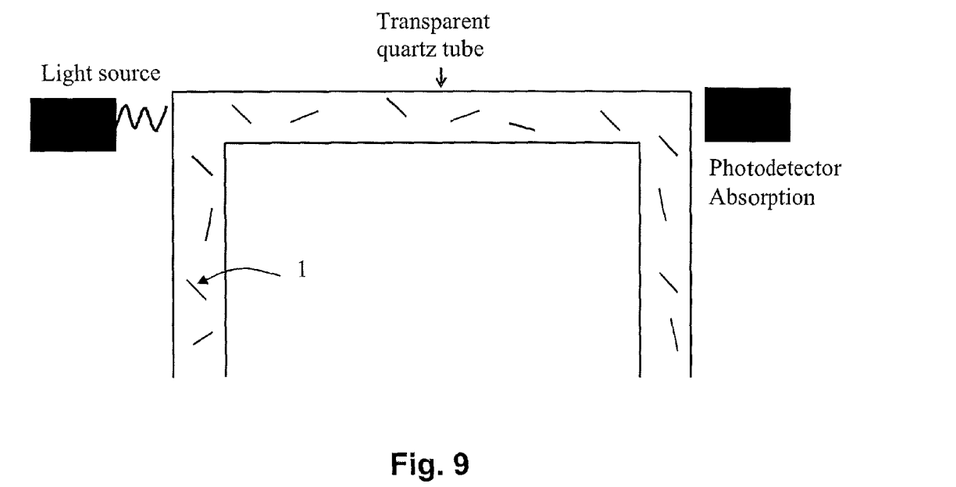

FIG. 9 schematically illustrates an arrangement for in-situ absorption measurements in a system for forming wires in accordance with the invention. This in-situ absorption measurement arrangement comprises a light source and an absorption detector arranged at e.g. a transparent quartz tube. For an absorption measurement the light should emanate from a white light source with collimated light. The absorption detector is preferentially placed in this alignment to the light source in order to maximize the absorption volume of the aerosol.

Figure 10:
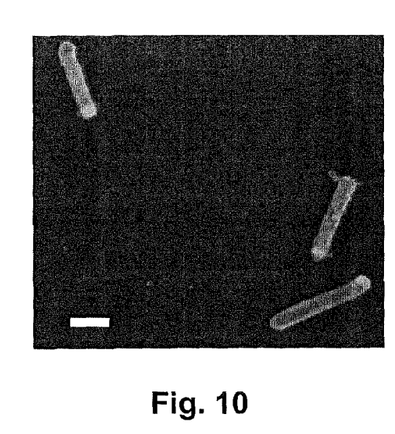
Figure 11:
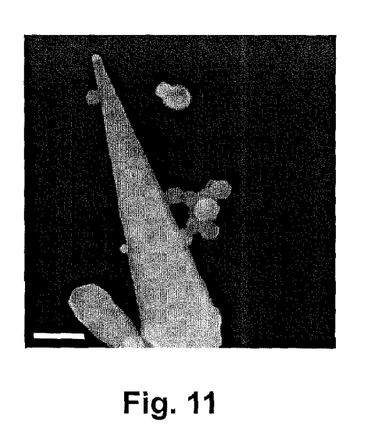
FIG. 11 shows wires of different configuration formed in a system in accordance with the invention.

As a further example of wires formed by the method and the system of the invention FIG. 10 and FIG. 11 shows scanning electron microscope (SEM) images of GaAs nanowires grown under two different growth conditions, hereinafter referred to as (i) and (ii), respectively. Au agglomerates are generated from molten Au in a high temperature furnace with a set temperature of (i) 1775° C. or (ii) 1825° C. The Au agglomerates are carried by 1680 sccm of $N_2$ carrier gas (hereinafter the carrier gas containing Au agglomerates/particles is termed aerosol) between the different modules of the growth system. After the high temperature furnace the Au agglomerates are charged with a single electron each. By using this single electron charge the Au agglomerates are size selected by a differential mobility analyzer, in this case set at 50 nm. The aerosol is passed through a sinter furnace with a temperature of 450° C. which compacts the Au agglomerates into spherical Au particles. After the sinter furnace the aerosol is mixed with the precursor gases TMGa and $AsH_3$, with a set molar flow of $2.4*10^{-2}$ mmol/min and $2.2*10^{-2}$ mmol/min respectively. The aerosol, including the precursor gases, enters the reaction furnace set to a temperature of (i) 450° C. or (ii) 625° C. Inside the reaction furnace the precursors decompose to form the material constituents Ga and As. The material constituents are supplied to the Au particles in the gas phase and a GaAs seed crystal is nucleated on the Au particle. The continued growth of the wire proceeds via two different growth modes, (i) an axial growth mode where material is incorporated in the interface between the Au particle and the GaAs seed crystal forming a wire, (ii) a combination of an axial and radial growth mode where material constituents are incorporated both at the Au particle-GaAs interface and on the side facets of the wire that is formed, forming a wire with a conical shape. After the reaction furnace the wires are transported by the carrier gas to a deposition chamber where a voltage of 6 kv is applied to a Si substrate to deposit the electrically charged wires. As shown in FIG. 10 the Au particle is visible and has a bright contrast compared to the darker nanowires. As shown in FIG. 11 the Au particle is visible having a bright contrast at the tip of the conically shaped nanowire.

The formation of GaAs nanowires typically takes place in the temperature regime between 380° C. and 700° C. depending on the desired shape and properties of the formed nanowires. A higher temperature typically results in a higher growth rate, i.e., longer nanowires for a set growth time, but also in a conical shape, along with effects on crystal structure and impurity incorporation. Besides temperature, the ratio of group V material precursor to group III material precursor, i.e., the V/III ratio, is important. If the V/III ratio is too low, typically below 0.2, the nanowire growth proceeds in a group III rich environment which can reduce the growth rate and material quality. If the V/III ratio is too high, typically above 5, the nanowires are difficult to nucleate since group III material can't be dissolved in the Au particles. Formation of GaAs nanowires typically takes place with a total pressure inside the reactor between 50 and 1100 mbar. A lower pressure reduces the supersaturation in the gas phase which can reduce parasitic gas phase reactions. A higher pressure increases the supersaturation in the gas phase which can increase the supersaturation in the Au particle and increase the growth rate. The pressure can also be used to control the residence time in the growth reactor.

It should be noted that parameters such as temperature, precursor flow, V/III ratio and pressure are dependent on the precursor molecules that are used since only the material that actually reaches the growth interface is incorporated. If a precursor can withstand higher temperatures without reacting, the nanowire-forming reaction most likely takes place at a higher temperature.

The above discussion on growth parameters is valid mainly for single stage growth, where nucleation and wire growth take place in a single reaction zone. For multiple stage growth, the first nucleation stage should typically be done at a higher temperature, lower precursor flow and lower V/III ratio, compared to the subsequent growth steps.

Compared with MOVPE nanowire formation in the described process typically takes place at a lower V/III ratio but at similar temperatures. Since parameters such as temperature, pressure, flows and V/III ratio are dependent on the exact chemistry used to form the nanowires it is understood that different materials may be formed at different parameters. For example III-nitrides may be formed at higher temperatures due to the higher stability of the $NH_3$ precursor, while InAs growth is done at lower temperatures.

Suitable materials for formation of the wires of the method and the system in accordance with the invention include, but are not limited to:

InAs, InP, GaAs, GaP and alloys thereof ($In_xGa_{1-x}As_yP_{1-y}$)
InSb, GaSb and alloys thereof ($In_xGa_{1-x}Sb$)
AlP, AlAs, AlSb and alloys thereof for example $AlP_{1-x}As_x$
InGaAsP alloyed with Al, for example $Al_xGa_{1-x}As$
InGaAsP alloyed with Sb, for example $GaAs_ySb_{1-y}$
InN, GaN, AlN and alloys thereof ($In_xGa_{1-x}N$)
Si, Ge and alloys thereof, i.e. ($Si_xGe_{1-x}$)
CdSe, CdS, CdTe, ZnO, ZnS, ZnSe, ZnTe, MgSe, MgTe and alloys thereof
$SiO_x$, C (Diamond), C (Carbon nanotube) SiC, BN Suitable materials for the catalytic seed particle include, but are not limited to:

Au, Cu, Ag
In, Ga, Al
Fe, Ni, Pd, Pt
Sn, Si, Ge, Zn, Cd
Alloys of the above, e.g., Au—In, Au—Ga, Au—Si Suitable gases for carrying the catalytic seed particles and the wires in the process include, but are not limited to: $H_2$, $N_2$ or a mixture thereof; or He, Ar.

Suitable dopants include, but are mot limited to, for
InGaAl—AsPSb system: n-dopants: S, Se, Si, C, Sn; p-dopants: Zn, Si, Be
AlInGaN system: n-dopants: Si; p-dopants: Mg
Si: n-dopants: P, As, Sb; p-dopants: B, Al, Ga, In
CdZn—OSSeTe system: p-dopants: Li, Na, K, N, P, As; n-dopants: Al, Ga, In, Cl, I According to common nomenclature regarding chemical formula, a compound consisting of an element A and an element B is commonly denoted AB, which should be interpreted as $A_xB_{1-x}$ It should be appreciated that the wire growth may comprise one or more etch steps, where material is removed rather than grown on the wires. Etching can also be used to decouple radial and axial growth, which for example enables lowering of the tapering of the wires or simple shape control of the wires.

The size of the wires depends on many factors such as the materials forming the wires, the intended application for the wires and the requirement on quality of the wires formed. Preferably the wires have diameter of less than 10 µm, and more preferably, in particular for formation of wires comprising lattice mismatched layers or segments, the wire diameter is less than 300 nm.

Since the wires of the invention may have various cross-sectional shapes the diameter, which interchangeably is referred to as width, is intended to refer to the effective diameter.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A method for forming nanowires comprising:
providing metal catalytic seed particles suspended in a gas,
providing Group III and Group V gaseous precursors, that comprise constituents of the nanowires to be formed,
dissolving the Group III material into the metal catalytic seed particles which comprise molten catalytic seed particles;
making at least one seed crystal at the surface of the at least one catalytic seed particle, and
growing epitaxially at least one nanowire crystal from the at least one formed seed crystal in a gas-phase synthesis including the gaseous precursors while the catalytic seed particles are suspended in the gas and the constituents of the nanowires to be formed are supersaturated in the at least one catalyst seed particle, wherein the at least one nanowire crystal is a III-V semiconductor crystal selected from gallium arsenide, gallium arsenide antimonide, gallium arsenide phosphide, indium gallium arsenide, aluminum gallium arsenide, gallium phosphide, indium gallium phosphide and indium phosphide.

2. The method of claim 1, wherein the nanowires are formed in a continuous process.

3. The method of claim 1, wherein the nanowires formed are carried by the gas.

4. The method of claim 1, wherein the growth conditions during growth of each nanowire are varied by controlling one or more of parameters associated with: precursor composition, precursor molar flow, carrier gas flow, temperature, pressure or dopants, such that a nanowire segment is axially grown on a previously formed nanowire portion in a longitudinal direction thereof, or a shell is radially grown on the previously formed nanowire portion in a radial direction thereof, or material is added as a combination of axial and radial growth.

5. The method of claim 4, wherein the growth conditions are varied to obtain heterostructures with respect to composition, doping, conductivity type within each nanowire.

6. The method of claim 4, wherein the growth conditions are varied over time by controlling one or more of parameters associated with: precursor composition, precursor molar flow, carrier gas flow, temperature, pressure or dopants, or the size distribution of the catalytic seed particles is varied, such that nanowires with different properties are formed.

7. The method of claim 1, wherein the catalytic seed particles are provided as an aerosol that is mixed with the gaseous precursors.

8. The method of claim 1, wherein the catalytic seed particles are provided by formation from gaseous reactants that comprises at least one of the constituents of the catalytic particles.

9. The method claim 1, wherein the gas containing the catalytic seed particles flows sequentially through one or more reaction zones, each reaction zone contributes to the nanowire growth by adding material to the nanowire, and the nanowires grown after passage through each reaction zone are carried by the gas.

10. The method of claim 1, wherein the catalytic seed particles are charged.

11. The method of claim 1, further comprising in-situ analysis of the nanowires formed.

12. The method of claim 11, further comprising controlling the nanowire growth by feedback from in-situ analysis parameters without interrupting the nanowire forming process.

13. The method of claim 11, wherein the in-situ analysis comprises illumination of the nanowires formed and detection of luminescence from the nanowires to determine optical properties of the nanowires.

14. The method of claim 1, further comprising depositing and aligning the nanowires from the gas phase on a substrate.

15. The method of claim 1, wherein the nanowires comprise a first portion and a second portion, wherein the first portion has a first composition or a first conductivity type and the second portion has a second composition or a second conductivity type, wherein the first composition or the first conductivity type is different from the second composition or the second conductivity type.

16. The method of claim 1, wherein:
the metal catalytic seed particles comprise gold catalytic seed particles; and
dissolving the Group III material into the metal catalytic seed comprises dissolving gallium into gold catalytic seed particles to form Au-Ga seed particles.

17. The method of claim 16, wherein a gaseous precursor is mixed with the gold catalytic seed particles prior to initiation of nanowire growth.

18. The method of claim 1, wherein the nanowires comprise a pn or pin junction in which a p or n doped nanowire segment is grown axially on another one of the p or n doped segment.

19. The method of claim 1, wherein a ratio of the Group V precursor to the Group III precursor is between 0.2 and 5.

20. The method of claim 1, wherein growing epitaxially at least one nanowire crystal occurs at a reactor pressure of between 50 and 1100 mbar.

* * * * *